(12) United States Patent
Tatebe

(10) Patent No.: US 7,014,333 B2
(45) Date of Patent: Mar. 21, 2006

(54) SMALL PORTABLE FLASHLIGHT

(75) Inventor: Hiroyuki Tatebe, Osaka (JP)

(73) Assignee: Unico Corp., Sakai (JP)

( * ) Notice: Subject to any disclaimer, the term of this patent is extended or adjusted under 35 U.S.C. 154(b) by 309 days.

(21) Appl. No.: 10/297,605

(22) PCT Filed: Jun. 18, 2001

(86) PCT No.: PCT/JP01/05191

§ 371 (c)(1),
(2), (4) Date: Jun. 9, 2003

(87) PCT Pub. No.: WO01/96781

PCT Pub. Date: Dec. 20, 2001

(65) Prior Publication Data

US 2005/0152138 A1   Jul. 14, 2005

(30) Foreign Application Priority Data

Jun. 16, 2000 (JP) .............................. 2000-180891

(51) Int. Cl.
*F21L 7/00* (2006.01)
(52) U.S. Cl. ................... 362/191; 362/190; 362/200; 362/201
(58) Field of Classification Search ............... 362/190, 362/191, 200, 205, 396, 208, 116, 201
See application file for complete search history.

(56) References Cited

U.S. PATENT DOCUMENTS

| | | | | |
|---|---|---|---|---|
| 4,360,930 A | * | 11/1982 | Blanchard | 362/105 |
| 4,858,082 A | * | 8/1989 | Hayward | 362/542 |
| 4,897,768 A | * | 1/1990 | Thul | 362/191 |
| 5,183,326 A | * | 2/1993 | Case | 362/191 |
| 5,359,501 A | * | 10/1994 | Stevens | 362/108 |
| 5,704,706 A | * | 1/1998 | Goldston et al. | 362/103 |
| 5,893,631 A | * | 4/1999 | Padden | 362/201 |
| 6,017,128 A | * | 1/2000 | Goldston et al. | 362/103 |

(Continued)

FOREIGN PATENT DOCUMENTS

JP          31-11612         7/1956

(Continued)

OTHER PUBLICATIONS

Japanese Office Action dated Jan. 18, 2002. Notice of the reason for rejection No. 2000-180891 with translation.

*Primary Examiner*—Thomas M. Sember
(74) *Attorney, Agent, or Firm*—Armstrong, Kratz, Quintos, Hanson & Brooks, LLP

(57) ABSTRACT

A small portable flashlight holds laminated platy batteries (11) on a circuit substrate (10) having a switching circuit on one surface thereof and one battery contact point (19) on the other surface thereof. Another battery contact point (22b) is provided on a contact arm (21) extending from the substrate so as to hold the batteries. The batteries, the circuit substrate and contact arm are held in lamination in a flat main body case part (9). A light emitting body (12) having a light emitting part exposed to the outside of the main body case is held on the side part of a laminated body. An operating part (13) moved to come into contact with or separate from the contact point of the switching circuit so as to perform the flashing operation of the light emitting body is provided on the upper or side part of the main body case. The portable flashlight can be reduced in size and, therefore, can be carried as if the flashlight is a key holder.

11 Claims, 9 Drawing Sheets

U.S. PATENT DOCUMENTS 6,082,872 A * 7/2000 Ting .......................... 362/205

FOREIGN PATENT DOCUMENTS

| JP | 60-122289 | 8/1985 |
| --- | --- | --- |
| JP | 7-73702 | 3/1995 |
| JP | 7-78502 | 3/1995 |
| JP | 08-276879 | 10/1996 |
| JP | 8-276879 | 10/1996 |
| JP | 10-325011 | 12/1998 |
| JP | 3062154 | 6/1999 |
| JP | 3065406 | 10/1999 |
| JP | 2000-85657 | 3/2000 |
| JP | 2000-149700 | 5/2000 |

* cited by examiner

SMALL PORTABLE FLASHLIGHT

TECHNICAL FIELD

The present invention relates to a small portable flashlight. More specifically, the present invention relates to a small portable flashlight which can be handled like a key holder and can be easily attached to a finger of the user, a frame of a bicycle and so on.

BACKGROUND ART

Conventional flashlights require big and heavy batteries in order to achieve a level of luminosity and operating time, and therefore are large in outside dimensions as well as inconvenient when carrying. Further, it is difficult to detachably mount these flashlights onto other structures.

In recent years, very small, highly luminous LEDs were developed. These highly luminous LEDs enable to drastically reduce the size of light emitting portion of the flashlights. Another recent development has made available small, thin, platy batteries. However, in order to use a light emitting body at a high luminosity and to achieve a long operating time, it is still necessary to use a battery bigger than the light emitting body.

Another problem lies in that the flashlight needs a switch mechanism and an electric circuit for the light to turn on and off. If a portable flashlight is designed to be small, the conventional switch mechanism and the electric circuit are undesirably larger than the light emitting body.

Further, users occasionally want to attach their flashlights tentatively on their finger or on a structure for convenience. However, conventional fitting mechanisms are larger than the light emitting body or the batteries, and have complicated structures. Further, the fittings are only to fit specific objects, and do not allow flexible use on other objects. Therefore, it is difficult to use conventional flashlights in two ways, i.e. as an ordinary portable flashlight in one way, and as an electric torch attachable to other structures in the other way.

DISCLOSURE OF THE INVENTION

The portable flashlight according to the present invention is very small. Therefore, it can be carried like a key holder, or attached easily to a finger of the user or other structures, without requiring any special mounts or parts.

A small portable flashlight according to the present invention comprises: a circuit substrate having a surface provided with a switching circuit, and another surface provided with a battery contact point; a platy battery laminated to and held by the circuit substrate, with one electrode contacted by the battery contact point; a contact arm extending from the circuit substrate and having a battery contact point contacted to another electrode of the battery; a flat main body case incorporating the circuit substrate, the battery and the contact arm; a light emitting body on a side of a laminate of the circuit substrate and the battery, including a light emitting portion exposed out of the main body case and a rear portion having lead wires extending therefrom connected to the circuit substrate; and an operating part on an upper portion or a side portion of the main body case for opening and closing the switching circuit to turn on and off the light emitting body.

The main body case preferably incorporates the circuit substrate, the battery and the contact arm, yet is as small as possible. The main body case can be provided by an assembly, for example, of an upper case half and a lower case half detachably fitted together at about halfway of the thickness. The main body case can be formed of resin by way of injection molding.

The circuit substrate and the platy battery are held as laminated directly with each other. This has made possible to reduce the size of the main body case than before. For overall miniaturization, the circuit substrate is preferably made into generally the same plan-view shape and size of the platy battery.

The circuit substrate has a surface away from the side on which the battery is placed, provided with a switching circuit for turning the light emitting body on and off.

The switching circuit may not only be able to turn the light emitting body on and off, but also be able to flash the light emitting body in predetermined patterns automatically.

The other surface of the circuit substrate is provided with a battery contact point. The battery contact point provided directly on the circuit substrate enables to establish electric connection by simply placing the battery onto the circuit substrate. The battery contact point can be formed by placing a conductive wire, forming a solder bead, etc. on the circuit substrate.

In order to establish connection with the other electrode of the battery, a contact arm is provided which extends from the circuit substrate to the battery electrode. Preferably, for example, the circuit substrate and the contact arm are formed generally in a shape of U as in a side view, so that the battery is sandwiched between the circuit substrate and the contact arm.

The light emitting body is disposed on the side of the circuit substrate and the battery, with its light emitting portion exposed outside of the main case. The lead wires extending from the rear of the light emitting portion are connected to the circuit substrate. By disposing the light emitting body on the side of the laminate of circuit substrate and battery, it becomes possible to reduce the height of the main case, enabling further and significant miniaturization of the portable flashlight.

The light emitting body can be provided by a variety of LEDs. For a wide range of application as a portable flashlight, it is preferable that the light emitting body is capable of emitting light at a high luminosity.

Preferably, as disclosed in claim 2, the light emitting body has a longitudinal axis aligned with a mean height of the laminate of the circuit substrate and battery, the light is thrown from a side of the main case, and the lead wires are bent for connection to the circuit substrate. Conventionally, the lead wires from the light emitting body are extended straightly and connected, in many case, directly to the circuit substrate. This often places limits on the shape and/or size of the circuit substrate as well as the design of the main body case. Further, unnecessary space due to the limitations has made it difficult to miniaturize the mechanism.

According to the present invention, the lead wires extending from the rear of the light emitting body are bent along the side of the laminate of battery and circuit substrate, to connection points on the circuit substrate. This enables the thickness of the main body to be generally the same as the height of the laminate of circuit substrate and battery.

The main body case has an upper portion or a side portion provided with an operating part which opens and closes the switching circuit for turning on and off the light emitting body. As disclosed in claim 3, the operating part can include an electrically conductive rubber member capable of opening and closing the switching circuit, and an operation member holding the electrically conductive rubber member and allowing the electrically conductive rubber member to contact the contact points of the switching circuit from outside the main body case for turning on and off the flashlight.

The light emitting body can be turned on and off by operating the operation member from outside the main case. The operation member may be moved vertically to or along the circuit substrate surface in order to make the electrically conductive rubber contact to and remove from the contacting points thereby opening and closing the circuit.

The switching circuit formed on the circuit substrate can be built so that the opening and closing operation of the contact points makes a sequential selection of turning-on, turning-off and soon. Further, as disclosed in claim 5, the circuit substrate can include a control circuit which flashes the light emitting body in a plurality of flashing patterns automatically. The patterns may include, for example, an intermittent flashing pattern. In this case, it is preferable that the opening and closing operation of the contact points via the operating part makes a selection sequentially from the flashing patterns and the turn-off state.

There is no specific limitation to the battery as long as it is platy. There is no limitation to the number of the batteries, either. Preferably, as disclosed in claim 4, a plurality of the batteries are laminated for increased voltage to attain a high luminance.

An invention in claim 6 provides an arrangement that the main body case further comprises: an elastic band having an end connected to an edge of the main body case; holding means formed on an upper portion or a side portion of the main boy and capable of holding the elastic band; and a fitting portion formed on a lower portion of the main body for fitting to an object. With this arrangement, the elastic band can be wound around the object and held by the holding means, with the fitting portion fitted onto the object, for holding the main body on the object.

The portable flashlight according to the present invention is flat and very small. Therefore, it is difficult to provide additional members or the like for attaching the flashlight to other structures. Thus, according to the present invention, an arrangement is made so that the attachment can be made by using the main body case itself.

According to the present invention, an elastic band having an end connected to an edge of the main body case is wound around an object and then held on the holding means, whereby the portable flashlight is held on the object.

There is no specific limitation to the elastic band, but preferably, the elastic band has a loop, since the loop can be hooked on the holding means, eliminating need for providing an additional holding member at a tip of the elastic band. Further, the loop simplifies the structure, making possible to reduce manufacturing cost.

There is no limitation to the holding means. Thus, the holding means can be a groove or a projection which can hold the elastic band. If the elastic band is stringy, the groove or the projection can be small in size, and will not affect esthetic appearance.

The fitting portion can be formed in accordance with the object to which the attachment is made. A recess having a tubular or spherical inner wall increases adaptability, making it possible to hold the flashlight on a variety of objects. The fitting portion may include a non-slip device. Alternatively, mounting means may be provided on the object, and the flashlight may be formed with a recess to be fitted by the mounting means.

Inventions disclosed in claim 7 through claim 11 relate to a small portable flashlight which can be attached to various objects with an elastic loop band.

The invention disclosed in claim 7 provides a small portable flashlight comprising: a flat main body case including a side surface holding a light emitting body; an elastic band including a loop portion, and connected to an edge of the main body case; holding means formed on an upper portion or a side portion of the main boy and capable of holding the loop portion; and a fitting portion formed on the lower portion of the main body for fitting to an object. With the above, the elastic band can be wound around the object and held by the holding means, with the fitting portion fitted onto the object, for holding the main body case on the object.

There is no limitation to the elastic band. Thus, the elastic band can be a rubber ring, a fiber-sheathed rubber ring, and so on. Further, the elastic band may not be elastic in its entirety, i.e. only a part of it may elastically expand.

There is no specific limitation to the loop, either, as long as the loop has a sufficient size capable of winding around the main body case. Also, the loop may be part of the elastic band.

The holding means can be realized in many ways. For example, according to the invention disclosed in claim 8, the holding means can be provided by a groove formed on an outer surface of the main body case. The groove may be formed only on the upper surface of the main body, or may be formed on the upper surface and the side surface.

Further, according to the invention disclosed in claim 9, the holding means can be provided by a ridge or a projection projecting out of the main body case. There is no limitation to the ridge or the projection, as long as the elastic loop can be held.

There is no limitation to the fitting portion, either. Thus, the fitting portion can be formed in accordance with the object to which the attachment is made. For example, the fitting portion provided by a recess as described in claim 10 increases adaptability. Further, the recess can take many forms. For example, the recess may have a tubular inner wall. Further, the recess can be oriented in any direction. For example, the recess may be aligned with, or perpendicular to, the direction in which the light is emitted from the light emitting body.

In addition, as disclosed in claim 11, the fitting portion can be provided by at least two ridges formed at a predetermined space.

BEST MODE FOR CARRYING OUT THE INVENTION

Figure 1:
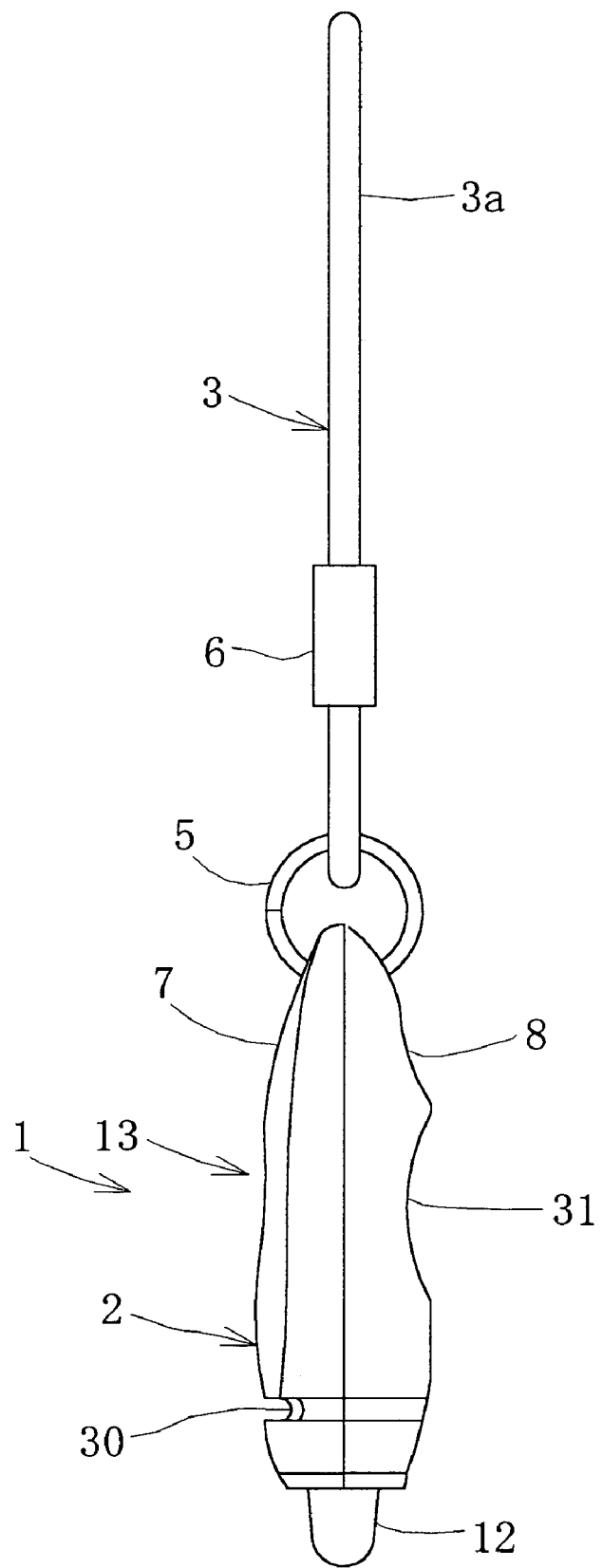
FIG. 1 is a front view of a portable flashlight according to the present invention.
Figure 2:
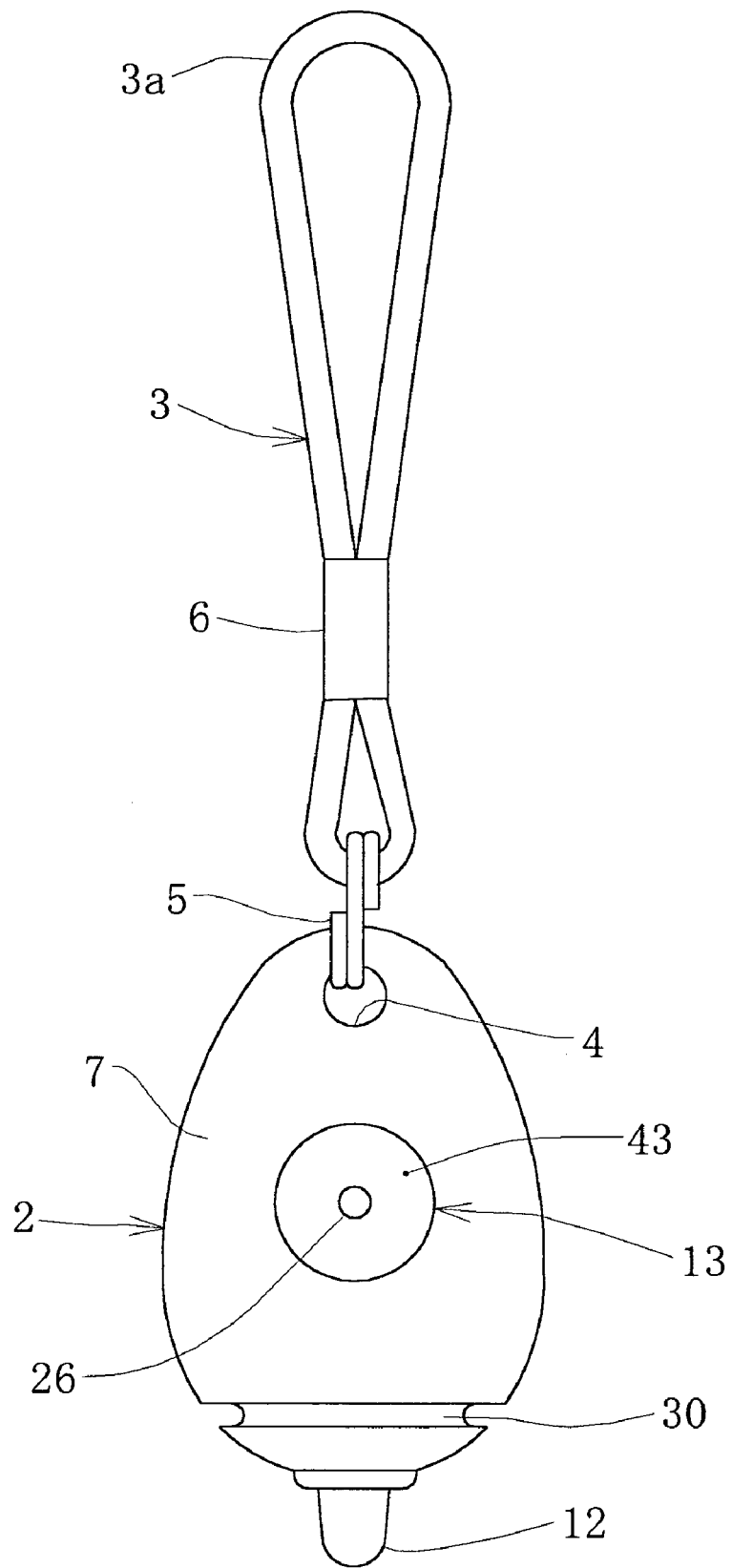
FIG. 2 is a plan view of the portable flashlight according to the present invention.
Figure 3:
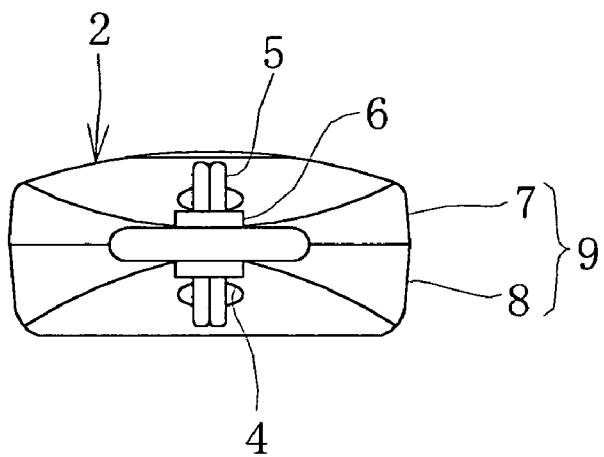
FIG. 3 is a right side view of the portable flashlight according to the present invention.
Figure 4:
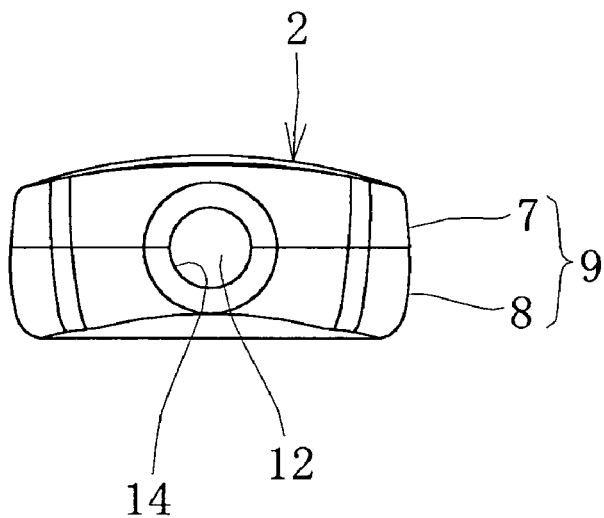
FIG. 4 is a left side view of the portable flashlight according to the present invention.
Figure 5:
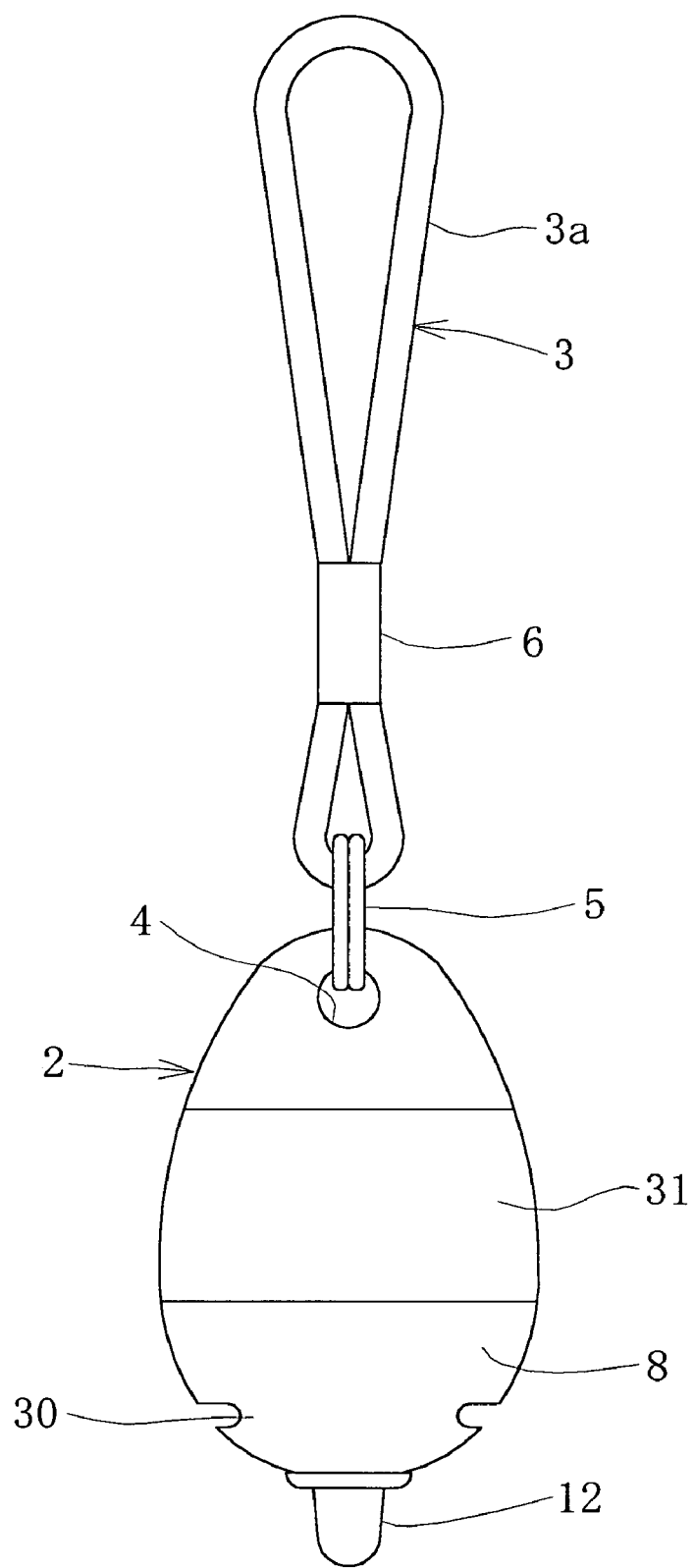
FIG. 5 is a bottom view of the portable flashlight according to the present invention.

As shown in FIG. 1 through FIG. 5, a portable flashlight 1 according to the present embodiment comprises a main body 2, and an elastic loop band 3 connected to a rear end of the main body 2. As shown in FIG. 2, the main body 2 has a plan-view outline like an egg. The rear end of the main body 2 is formed with a connecting hole 4 penetrating the main body vertically, to which the elastic band 3 is attached via a metal ring 5. The elastic band 3 has an intermediate portion provided with a tie 6.

Figure 8:
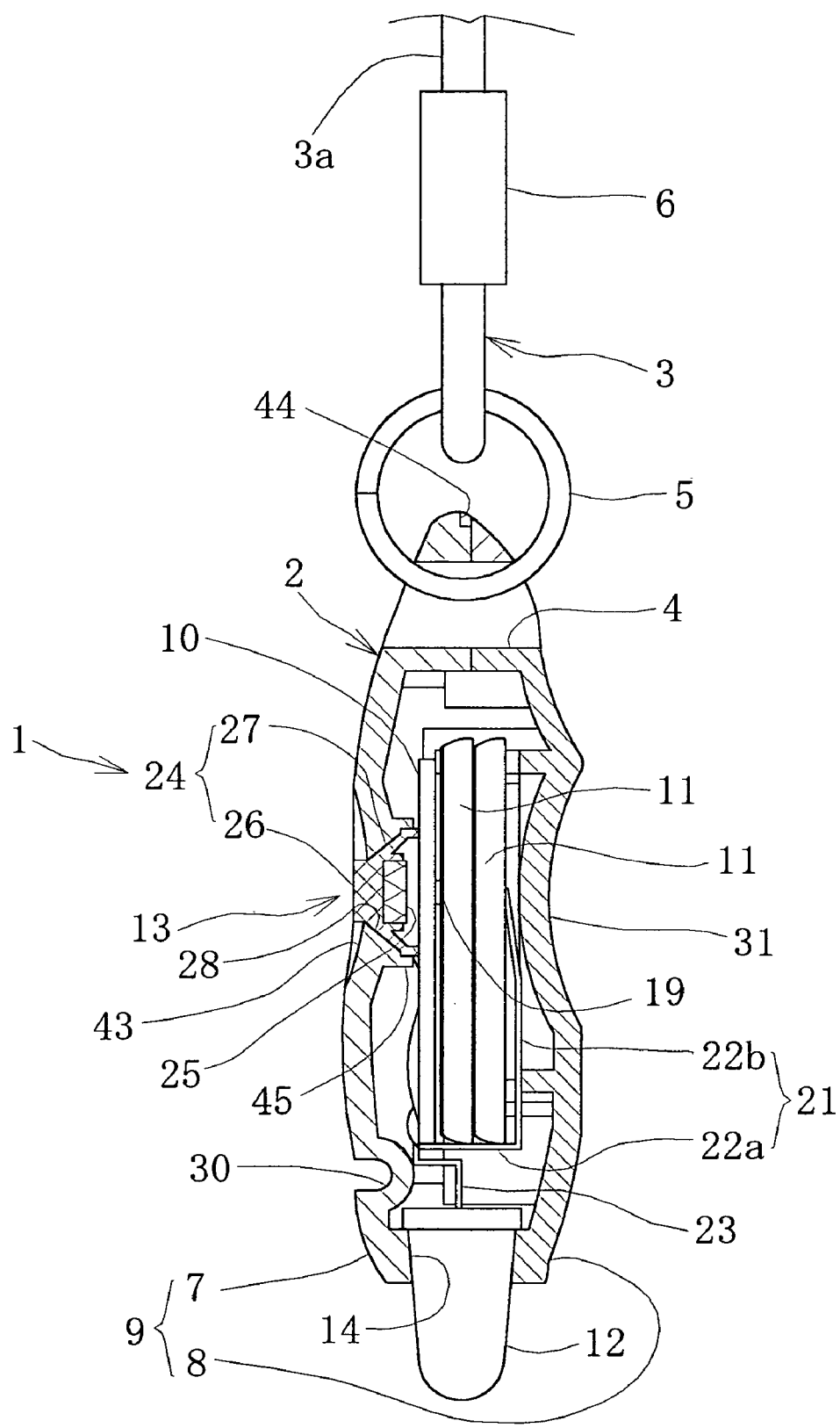
FIG. 8 is a sectional view of a primary portion, showing an inner structure of the portable flashlight in FIG. 1.

As shown in FIG. 8, the main body 2 includes: a main body case 9 provided by an upper member 7 and a lower member 8; and a circuit substrate 10, two disc-shaped batteries 11, 11, and a light emitting body 12 incorporated in the main body case 9. The upper member 7 has a center region provided with an operating part 13 that allows the light emitting body 12 to be turned on and off. The main body 2 according to the present embodiment has a thickness of about 10 mm, and a vertical length and a lateral width as in FIG. 2 of 26 mm and 36 mm respectively.

The upper member 7 and the lower member 8 are formed of resin by way of injection molding, and are assembled to each other by fitting unillustrated projections formed in the upper member 7 into unillustrated recesses formed in the lower member 8. The upper member 7 and the lower member 8 have their front side surfaces formed with a retaining hole 14 capable of holding the light emitting body 12 as exposed to the outside. Further, their rear ends provide a notch 44, into which a flat blade of a screwdriver for example can be pressed to disassemble the upper member 7 and the lower member 8 from each other for such a purposes as replacing the batteries.

Figure 7:
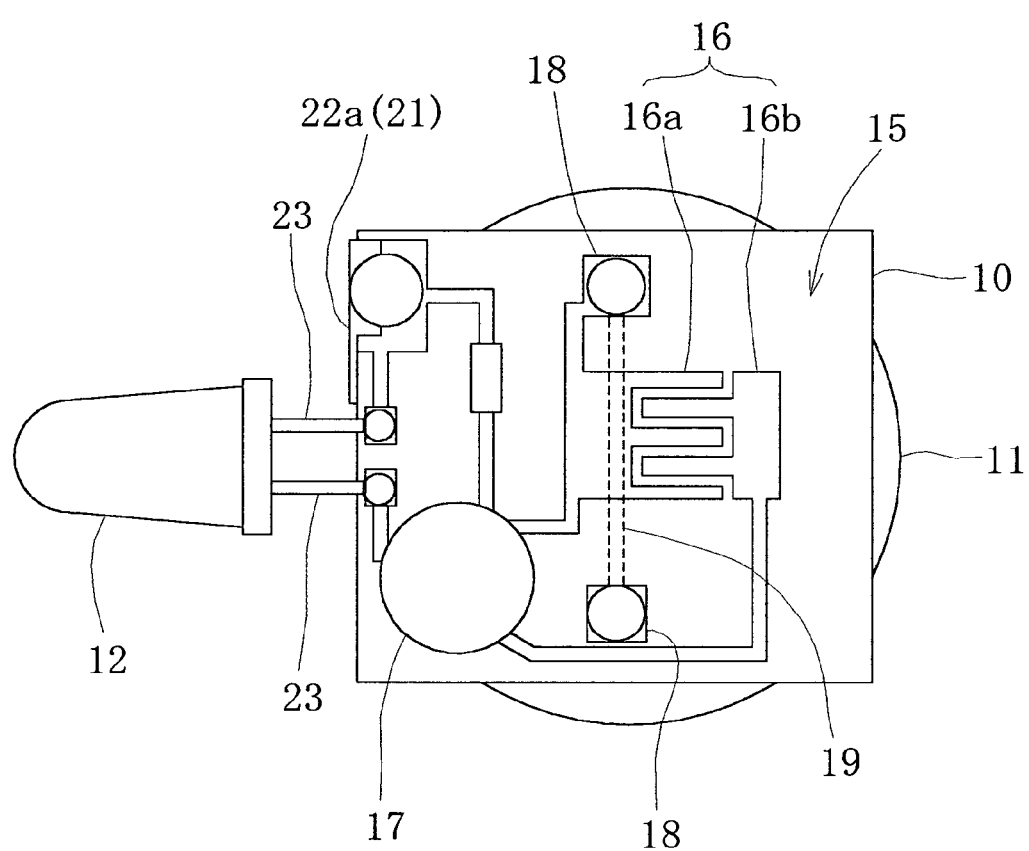
FIG. 7 is a plan view showing the assembly of the circuit substrate, the battery and the light emitting body.

As shown in FIG. 7, the circuit substrate 10 is made of a known material and into a generally rectangular plan-view shape of a size as large as the battery 11, and includes a switching circuit 15 formed on one surface. The switching circuit 15 includes a contact portion 16 provided with a contact points 16a, 16b which are closed and opened by the operating part 13, and a control circuit 17 which turns the light emitting body 12 on and off in response to the closing and opening operation of the contact portion 16. The switching circuit 15 is coated with an insulating material except for the contact portion 16.

The circuit substrate 10 has another surface provided with a piece of copper wire 19 which is connected to contact points 18 formed on the other side via through holes. The copper wire 19 serves as a battery contact point, and makes direct contact with an electrode 20a of one of the laminated batteries 11.

The circuit substrate 10 has a front edge provided with a contact arm 21 for contact with the other battery electrode 20b of the laminated batteries 11, 11. The contact arm 21 includes an extended portion 22a extending downwardly along the batteries 11, 11, and a battery contact point 22b which is a portion bent at an end of the extended portion 22a for making elastic contact with the other battery electrode 20b. The two platy batteries 11, 11 are held as laminated between the circuit substrate 10 and the battery contact point 22b. According to the present embodiment, two disc-shaped batteries are connected in series so as to supply a high voltage sufficient for achieving a high luminosity of the light emitting body.

Figure 6:
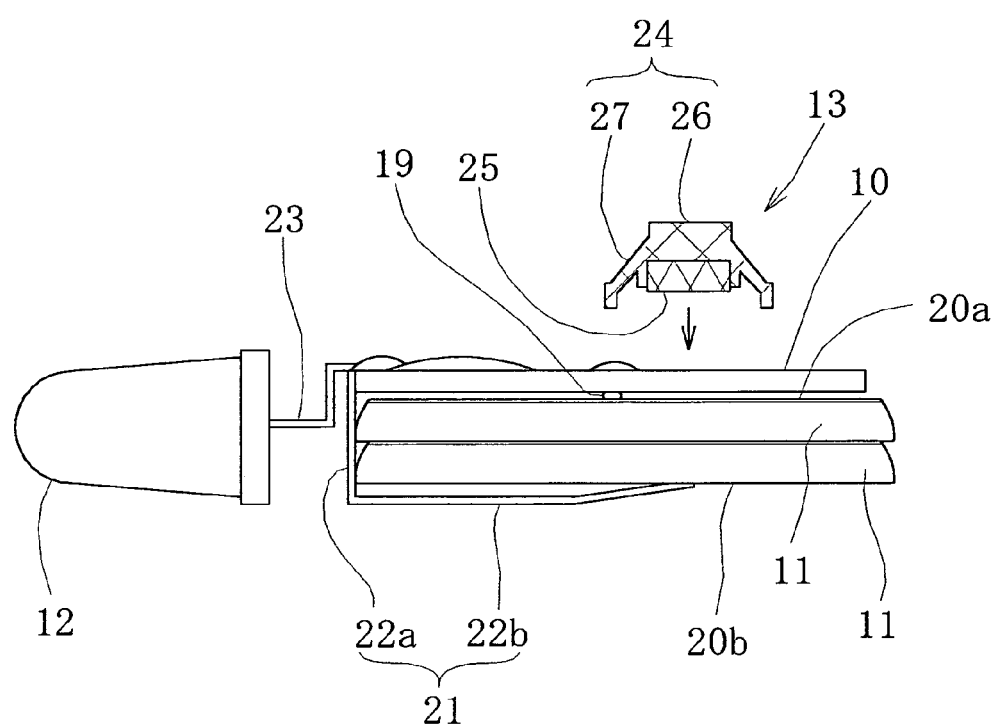
FIG. 6 is a front view showing an assembly of a circuit substrate, a battery and a light emitting body.

The light emitting body 12 is provided by a highly luminous white LED. As shown in FIG. 6, the light emitting body 12 has its center axis aligned generally with a mean height of a laminate of the batteries 11, 11 and the circuit substrate 10. The light emitting body 12 has its tip portion exposed from the retaining hole 14 formed at a location where the upper member 7 and the lower member 8 meet with each other, so that the light can be thrown outwardly from the side of the main body 2.

The light emitting body 12 has a rear end, from which two lead wires 23 are extended, then bent up generally in a shape of L, to reach the surface of the circuit substrate 10, and then soldered to respective terminals on the edge of the circuit substrate. This arrangement enables the overall height of the flashlight to be generally the same as the height of the laminate of circuit substrate 10 and batteries 11, 11, making it possible to manufacture a miniaturized and thin portable flashlight.

As shown in FIG. 6 and FIG. 8, the operating part 13 includes an elastic operation member 24 which holds a piece of electrically conductive rubber 25 at a space above the contact portion 16 of the circuit substrate 10.

The operation member 24 includes an upper portion 26 which is cylindrical and a skirt 27 which has a conical outer surface, and has a hollow which opens downwardly. The skirt 27 has an inner space to which the disc-shaped conductor rubber 25 is fitted at a space to the contact portion 16. The upper portion 26 projects out of a through hole 28 formed in the upper member 7. The through hole 28 has a conical inner wall corresponding to the outer wall of the skirt 27, and includes a lower edge formed into a holder portion 45 having a tubular inner wall. On the other hand, the skirt 27 has a lower edge having a tubular outer wall for fitting into the holder portion 45, thereby holding the operation member 24 in the through hole 28. The above arrangement enables easy assembly. Further, when the upper member 7 and the lower member 8 are separated from each other, the operation member 24 is still retained in the upper member 7, facilitating battery replacement for example.

The through hole 28 opens outside, in a recess 43 having a concave wall that generally follows a spherical surface. The upper portion 26 projects from the center portion of the recess 43. When the upper portion 26 is pressed downwardly, the skirt 27 of the operation member 24 is deformed, allowing the conductor rubber 25 to contact the contact portion 16 thereby closing the contact points 16a, 16b. Then, a signal is outputted to turn on the light emitting body 12. When the pressure is removed, elastic return of the skirt 27 lifts the conductor rubber 25 from the contact portion 16. The present embodiment includes the control circuit 17, which allows a switching cycle of three states. Specifically, as the opening and closing operation of the contact portion 16 is repeated, the circuit state switches sequentially in a cycle of stay-on, flashing and turned-off.

The recess 43 according to the present embodiment shares a circular border with the smoothly curved upper member 7, and this border circle has a diameter of approximately 7 mm. The depth of the recess from an outer edge of the upper member 7 is approximately 0.7 mm. The upper portion 26 does not project further beyond the recess 43. When pressing the upper portion 26, the user places his thumb or finger into the recess 43 and uses the face of the thumb or the finger to press. With this arrangement, the light emitting body is not accidentally turned on when the flashlight is carried in a pocket for example. Further, it becomes possible to make the operating part 13 very thin, enabling to make the main body 2 thin.

Figure 9:
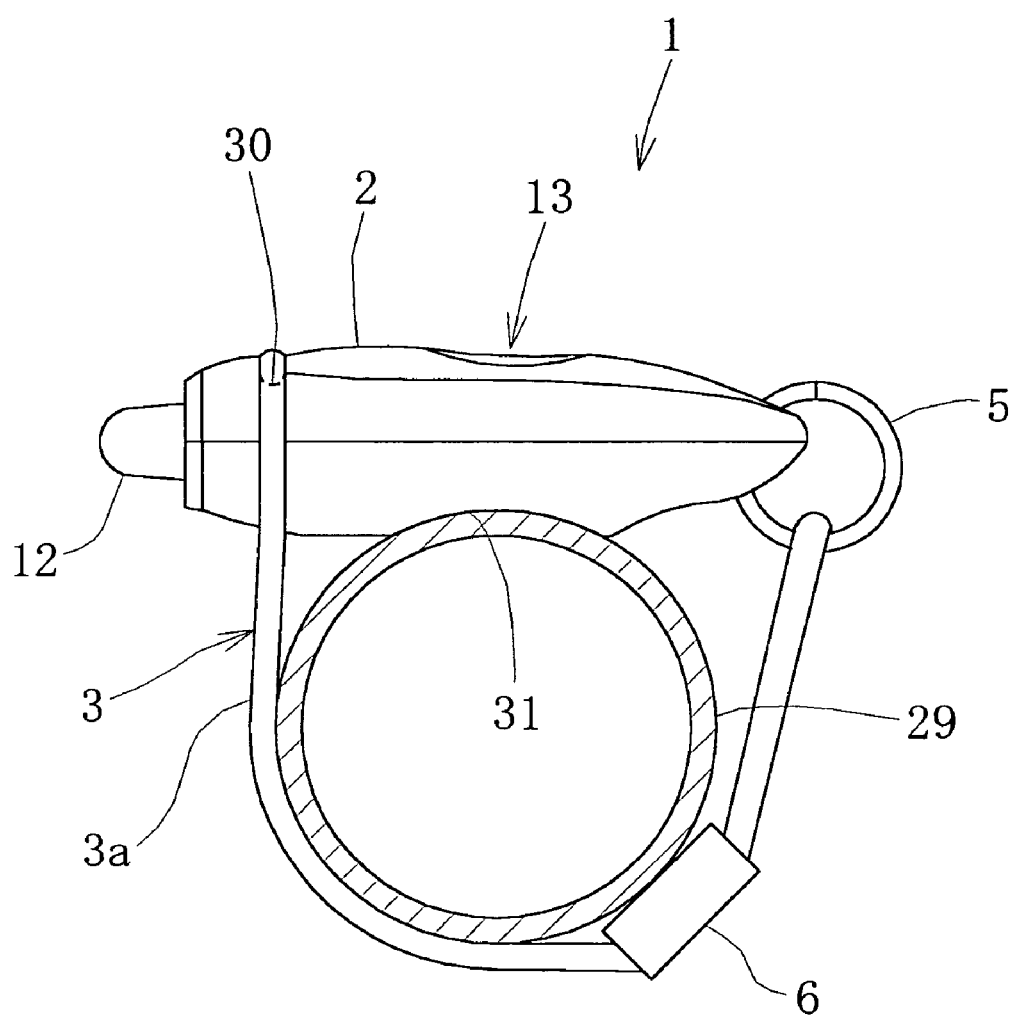
FIG. 9 is a side view showing the portable flashlight in FIG. 1 attached to a handlebar of a bicycle.

FIG. 9 shows the portable light 1 according to the present invention attached to a handlebar 29 of a bicycle.

The main body case 9 according to the present invention has an upper surface and side surface formed with a retaining groove 30. The retaining groove 30 has a width and depth capable of holding a loop portion 3a of the elastic band 3.

The main body case 9 has a lower surface formed with a fitting portion 31 having a concave surface having a tubular wall. The fitting portion 31 is fitted to an upper surface of the handlebar 29, the elastic band 3 is wound around a lower portion of the handlebar 29, and then the loop portion 3a is hooked into the retaining groove 30. With this arrangement, the portable light 1 can be easily attached to the handlebar 29. In addition, detaching of the flashlight can be easily done by simply unhooking the loop portion 3a of the elastic band 3 from the retaining groove 30.

The portable flashlight according to the present invention is flat, small and light-weighted, and therefore can be held securely with an elastic force provided by e.g. a fine rubber string. For this purpose, the main body case 9 only needs to be formed with the retaining groove 30 for hooking the elastic band 3, without the size of the portable light 1 increasing. In addition, absence of any projection out of the surface of the main body provides a good esthetic design.

Further, the operating part 13 is located at a place corresponding to the center region of the fitting portion 31. Therefore, when the operating part 13 is pressed to turn on and off the light, the applied pressure is backed appropriately by the handlebar. Thus, the main body 2 is not slipped off the position around the handlebar 29. Thus the flashlight is stable while being turned on and off.

Figure 10:
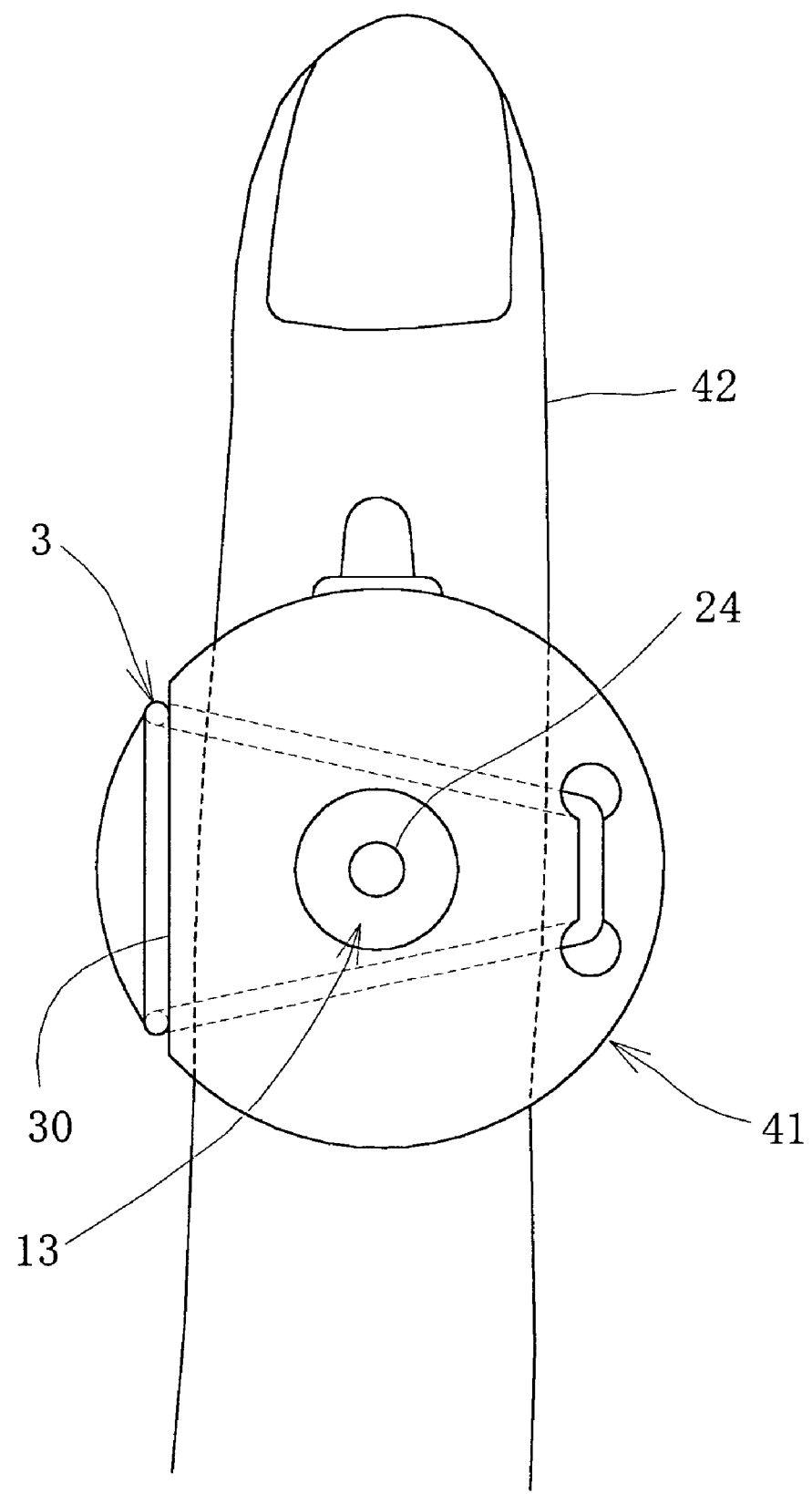
FIG. 10 is a plan view showing another embodiment of the present invention.

FIG. 10 shows another embodiment according to the present invention. This embodiment enables to hold a small portable flashlight 41 on a finger 42 of the user. According to this embodiment, in order to throw the light in a direction pointed by the finger, an unillustrated fitting portion that is fitted to the finger has its longitudinal axis aligned with the direction in which the light is thrown. This arrangement enables to throw the light in a direction pointed by the finger, offering convenience for precision work for example. Further, the elastic band 3 is a loop passing through a pair of through holes formed at an edge region.

The scope of the present invention is not limited by the embodiments so far described. For example, the operating part provided in the upper surface of the main body case may alternatively provided on a side surface of the main body case.

Further, according to the embodiment, the holding means for retaining the elastic band is provided by a groove formed on the upper and side surfaces of the main body case. Alternatively, the main body case may be formed with a projection, or the hooking groove may be formed only on the upper surface or on the side surfaces of the main body case.

Still further, the fitting portion can take a variety of shapes, or may be provided by a non-slip rubber piece formed with a recess, for example.

The invention claimed is:

1. A small portable flashlight comprising:
   a circuit substrate having a surface provided with a switching circuit, and another surface provided with a battery contact point;
   a plurality of platy batteries laminated for increased voltage to and held by the circuit substrate, with one electrode contacted by the battery contact point;
   a contact arm extending from the circuit substrate and having a battery contact point contacted to another electrode of the batteries;
   a flat main body case incorporating the circuit substrate, the batteries and the contact arm;
   a light emitting body on a side of a laminate of the circuit substrate and the batteries, including a light emitting portion exposed out of the main body case and a rear portion having lead wires extending therefrom connected to the circuit substrate; and
   an operating part on an upper surface or a side surface of the main body case, contacted to and removed from contact points of the switching circuit thereby turning on and off the light emitting portion,
   wherein the light emitting body has a longitudinal axis aligned with a mean height of a laminate of the circuit substrate and batteries, the light being thrown from a side of the main case, the lead wires being bent for connection to the circuit substrate, and
   wherein the overall height of the light emitting body is generally the same as the height of the laminate of circuit substrate and batteries.

2. The small portable flashlight according to claim 1, wherein the light emitting body has a longitudinal axis aligned with a mean height of a laminate of the circuit substrate and battery, the light being thrown from a side of the main case, the lead wires being bent for connection to the circuit substrate.

3. The small portable flashlight according to claim 1 or 2, wherein the operating part includes:
   an electrically conductive rubber member capable of opening and closing the switching circuit; and
   an operation member holding the electrically conductive rubber member and allowing the electrically conductive rubber member to contact the contact points of the switching circuit from outside the main body case for turning on and off the flashlight.

4. The small portable flashlight according to claim 1 or 2, wherein a plurality of the batteries are laminated between the circuit substrate and the battery contact point of the contact arm.

5. The small portable flashlight according to claim 1 or 2, wherein the circuit substrate includes a control circuit for selection from a plurality of flashing patterns.

6. The small portable flashlight according to claim 1 or 2, further comprising:
   an elastic band having an end connected to an edge of the main body case;
   holding means formed on an upper portion or a side portion of the main body and capable of holding the elastic band; and
   a fitting portion formed on a lower portion of the main body for fitting to an object;
   wherein the elastic band can be wound around the object and held by the holding means, with the fitting portion fitted onto the object, for holding the main body on the object.

7. A small portable flashlight comprising:
   a flat main body case including a side surface holding a light emitting body;
   an elastic band including a loop portion, and connected to an edge of the main body case;
   holding means formed on an upper portion or a side portion of the main body and capable of holding the loop portion; and
   a fitting portion formed on the lower portion of the main body for fitting to an object;

wherein the elastic band can be wound around the object and held by the holding means, with the fitting portion fitted onto the object, for holding the main body case on the object.

8. The small portable flashlight according to claim 7, wherein the holding means is provided by a groove formed on a surface of the main body case.

9. The small portable flashlight according to claim 7, wherein the holding means is provided by a ridge or a projection projecting out of the main body case.

10. The small portable flashlight according to one of claims 7 through claim 9, wherein the fitting portion is provided by a recess.

11. The small portable flashlight according to one of claim 7 through claim 9, wherein the fitting portion is provided with at least a ridge.

* * * * *